(12) United States Patent
Goldman et al.

(10) Patent No.: US 6,385,710 B1
(45) Date of Patent: *May 7, 2002

(54) MULTIPLE-MODE EXTERNAL CACHE SUBSYSTEM

(75) Inventors: Gary S. Goldman, San Jose; Christopher Chen, Danville; Douglas W. Forehand, Mountain View, all of CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/605,881

(22) Filed: Feb. 23, 1996

(51) Int. Cl.[7] .............................................. G06F 12/00
(52) U.S. Cl. .................... 711/169; 711/168; 711/170; 711/161; 711/211; 364/232.8; 364/238
(58) Field of Search .................................... 395/375, 309, 395/468, 421.01, 478; 345/201; 365/230.08, 190, 230.03

(56) References Cited

U.S. PATENT DOCUMENTS

| | | | | |
|---|---|---|---|---|
| 4,893,233 A | * | 1/1990 | Denman et al. | 395/375 |
| 4,912,630 A | * | 3/1990 | Cochcroft, Jr. | 395/421.01 |
| 4,958,304 A | * | 9/1990 | Moore | 345/201 |
| 5,197,143 A | * | 3/1993 | Lary et al. | 395/309 |
| 5,249,160 A | * | 9/1993 | Wu et al. | 365/230.08 |
| 5,289,415 A | * | 2/1994 | DiMarco et al. | 365/190 |
| 5,434,993 A | | 7/1995 | Liencres et al. | |
| 5,524,233 A | * | 6/1996 | Milburn et al. | 395/468 |
| 5,530,941 A | * | 6/1996 | Weisser et al. | 395/478 |
| 5,621,695 A | * | 4/1997 | Tran | 365/230.03 |

OTHER PUBLICATIONS

Application Note, Pentium Processor Clock Design, by Derrick Lin, Jim Reilly, Oct. 1993, Intel.*

Pentium Processor User's Manual, vol. 3; Architecture and Programming Manual, 1994.*

Bacon, D.F., "Cache Advantage,"*BYTE* (Aug. 1994), pp. 79–86.

* cited by examiner

*Primary Examiner*—Tod R. Swann
*Assistant Examiner*—Fred F. Tzeng
(74) *Attorney, Agent, or Firm*—Gunnison, McKay & Hodgson, L.L.P.; Philip J. McKay

(57) ABSTRACT

In accordance with the present invention, a cache memory subsystem includes a processor, a cache control unit and a SRAM serving as the cache memory. The SRAM is a synchronous SRAM. The cache control unit provides appropriately timed control signals to the SRAM when the processor is accessing the cache memory. The SRAM can be either a pipelined architecture SRAM (register output SRAM) or a flow-through access architecture SRAM (latch output SRAM). The cache control unit is selectably configured to operate in a pipelined mode (1-1-1) or a flow-through (2-2) mode. The cache control unit is configured in the 1-1-1 mode when the SRAM is a pipelined architecture SRAM having a clock rate equal to the processor. When the SRAM is a flow-through architecture SRAM that cannot be clocked at the same rate as the processor, the cache control unit is configured in the 2-2 mode and the SRAM is clocked at a clock rate half of the processor clock rate.

29 Claims, 4 Drawing Sheets

MULTIPLE-MODE EXTERNAL CACHE SUBSYSTEM

FIELD OF THE INVENTION

The present invention is related to cache memories and, more particularly, to high-speed synchronous external cache memory subsystems.

BACKGROUND OF THE INVENTION

High performance processor systems generally include an external cache memory to improve the system's performance. In many of the highest performance processor systems currently available, the external cache is implemented with high speed synchronous static random access memories (SRAMs). These conventional high performance processor systems typically use SRAMs having either a pipelined architecture or having a flow-through access architecture.

In general, pipelined architecture SRAMs are faster than flow-through architecture SRAMs. However, pipelined architecture SRAMs typically are smaller (i.e., in memory size) and more expensive than flow-through type SRAMs. Moreover, pipelined architecture SRAMs capable of operating at the same rate expected for the next generation of processors (e.g., at clock rates of over 200 MHz) are expected to be especially expensive. Consequently, processor designers can trade-off speed for cost and memory size by designing the processor to support operation with either pipelined architecture SRAMs or flow-through architecture SRAMs. The applicants are not aware of any processor systems that support operation in both modes.

In addition, as processor and SRAM technology improves, increases in clock rate for synchronous SRAMs are expected to lag behind the increases in clock rate for processors. As a result, when a new generation of processors is released, SRAMs capable of operating at the processor's clock rate may not yet be available. Accordingly, as processor clock rates increase, there is a need for these processors to be capable of having optimal performance with both SRAMs that can and cannot operate at the same clock rate as the processor.

SUMMARY OF THE INVENTION

In accordance with the present invention, a cache memory subsystem includes an external synchronous RAM, a processor and a cache control unit. The external synchronous RAM the processor, and the cache control unit all interact with each other as the processor accesses the cache memory. In one embodiment, the cache control unit is built into the processor and the synchronous RAM is a SRAM that serves as the external cache memory. The cache control unit provides appropriately timed control signals to the SRAM when the processor is accessing the cache memory. The SRAM can be either a pipelined architecture SRAM (register output SRAM) or a flow-through access architecture SRAM (Catch output SRAM). The cache control unit is selectably configured to operate in either a pipelined mode (1-1-1) when the SRAM is a register output SRAM, or a flow-through (2-2) mode when the SRAM is a latch output SRAM. Pipelined architecture SRAMs having a clock rate equal to the processor can be operated in the 1-1-1 mode, which has a lower latency than the 2-2 mode. In accordance with the present invention, SRAMs that cannot be clocked at the same rate as the processor are then accessed in the 2-2 mode at a clock rate that is half of the processor clock rate. The 2-2 mode has a lower latency than simply clocking a pipelined architecture SRAM at half the processor clock rate, as is done in some conventional cache subsystems. Accordingly, a cache subsystem according to the present invention has better performance than these conventional subsystems when using relatively slow SRAMs.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
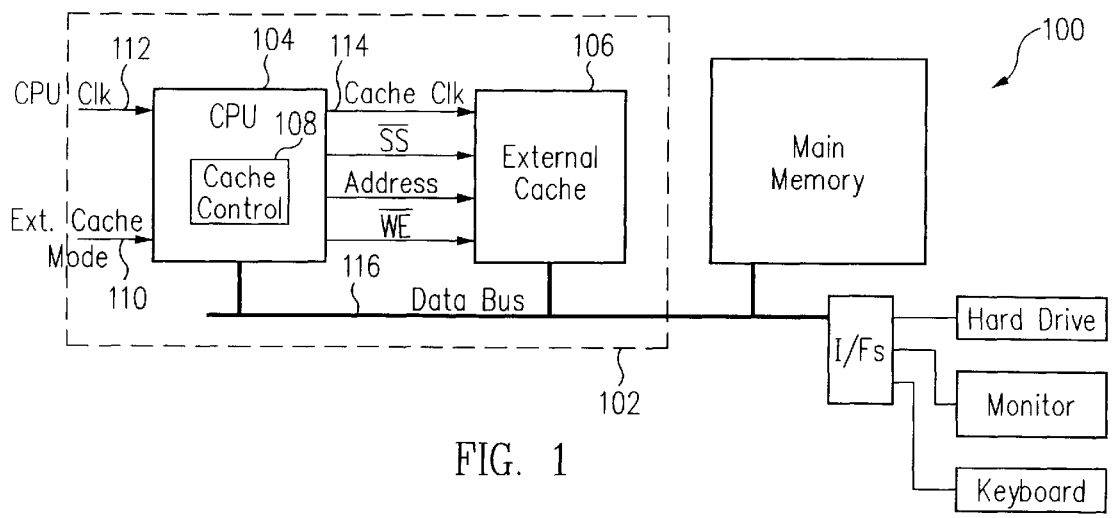
FIG. 1 is a system level block diagram of a computer system including an external cache subsystem according to one embodiment of the present invention.

FIG. 1 is a system level block diagram of a computer system 100 including an external cache subsystem 102 according to one embodiment of the present invention. In this embodiment the cache subsystem 102 includes a processor 104, an external cache 106, and a cache control unit 108. In one embodiment of the cache subsystem 102, the processor 104 includes the cache control unit 108, although in other embodiments the cache control unit can be external to the processor. The processor 104 is coupled to the cache control unit 108 and provides external cache access commands to the cache control unit to request memory accesses. The cache control unit 108 is connected to the external cache 106 and provides control signals to the control cache access in response to the commands from the processor.

The external cache 106 can be a first level cache or second level cache, depending on whether the processor 104 has an on-board cache. For high-performance systems, the external cache 106 is a high speed synchronous SRAM which can be operated at speeds compatible with the processor. The computer system 100 can be any type of computer system such as, for example, a system with a main memory and interfaces to peripheral devices such as mass storage devices (e.g., hard drive), displays (e.g., monitor), or input devices (e.g., keyboard). Moreover, the present invention can be used with various types of processors such as, for example, X86, Sparc®, Alpha®, MIPS®, HP®, and PowerPC® processors.

In operation, the cache control unit 108 in the processor 104 can be configured to support two modes of SRAM operation in the external cache, depending on the speed and architecture of the SRAM 106. The processor 104 is configured by a configuration signal received through a lead 110. In one embodiment, the lead 110 is selectably hardwired to either a ground line or a power line to provide either a logic low or logic high configuration signal, respectively. Of course, in other embodiments, the configuration signal may be provided by any suitable source, such as memory, register or latch.

In the first mode, which is a pipelined or 1-1-1 mode, the SRAM 106 is clocked at the same rate as the processor 104. The processor receives an external clock signal from a timing circuit (not shown) at a lead 112. In one embodiment, the external clock signal serves as the processor clock signal. Of course, in other embodiments, the processor clock signal may be provided in any suitable manner. For example, in one embodiment, the processor includes a frequency doubler that receives the external clock signal from the external timing circuit and then doubles the frequency of this signal for use as the processor clock signal. The processor 104 then also provides this "doubled" signal to the SRAM 106 via a lead 114 to serve as a SRAM clock signal. The SRAM 106 can be any suitable synchronous pipelined SRAM such as, for example, a model IBM043611RLA SRAM available from International Business Machines (IBM), the datasheet of which is incorporated herein by reference. Typically, this type of SRAM has an output register, which is clocked during the third clock cycle of a read operation to provide the output data to the processor 104.

The cache control unit 108 provides command signals to the SRAM 106 causing the SRAM 106 to perform read, write or deselect operations operation of the 1-1-1 mode, one processor clock cycle each is required for providing an address to the SRAM 106 from the processor 104, accessing the SRAM 106, and returning the data from the SRAM 106 to the processor 104 on the data bus 116 (hence the name 1-1-1). Accordingly, the read latency of the 1-1-1 mode is three processor clock cycles. In a write operation, the cache controller provides two deselect commands before issuing a write command following a read command (i.e., bus turnaround) to cause a "dead cycle" on bus turnaround to prevent contention on the data bus. The 1-1-1 mode in described below in more detail in conjunction with FIG. 3.

In the second mode, which is a flow-through access or 2-2 mode, the SRAM 106 is clocked at a multiple of the processor's clock rate. For this mode, the SRAM 106 can De any suitable flow-through access architecture SRAM, such as a model CXK77B3610 SRAM available from Sony. In one embodiment, the SRAM 106 receives a SRAM clock signal of one half the processor clock rate from the processor 104. In an embodiment where the processor 104 doubles the external clock signal received at the lead 112, the clock input lead 114 of the SRAM 106 may simply be coupled to the lead 112. For example, in such an embodiment the processor 104 may include a multiplexer or other switching circuit (not shown) to provide either the external clock signal (i.e., in the 2-2 mode) or the doubled clock signal (i.e., in the 1-1-1 mode) to the SRAM 106.

Typically, the processor 104 is configured in the 2-2 mode when a flow-through access type of SRAM is used and the SRAM is slower than the processor. However, the SRAM must still be fast enough that when clocked at half the clock rate of the processor, the SRAM has sufficient time to read and write data into its SRAM array. The cache control unit 108 may use a clock skewing scheme to facilitate the fast access times required in the 2-2 mode. The 2-2 mode is described below in more detail in conjunction with FIG. 5.

Typically, a flow-through architecture SRAM has an output latch to provide output data hold time, rather than an output register as in the pipelined architecture SRAM described above.

In the 2-2 mode, the cache control unit 108 provides command signals to the SRAM 106 causing the SRAM 106 to perform read or write operations. In a read operation, two processor clock cycles (i.e., one SRAM clock cycle) each are required for providing an address to the SRAM 106 from the processor 104, and for accessing and returning the data from the SRAM 106 to the processor 104 (hence the name 2-2). Accordingly, the read latency of the 2-2 mode is four processor clock cycles. As a result, the 2-2 mode advantageously provides a lower read latency compared to merely halving the SRAM clock frequency with a slow pipelined architecture SRAM (i.e., which would have a six processor clock read latency), as is done in some conventional cache subsystems. In addition, during write operations, the cache controller need not provide deselect commands between a write command followed by a read command. No deselect commands are needed because the slower SRAM clock frequency allows sufficient time to appropriately turn on or off the bus drivers of the processor and the SRAM 106 to avoid contention on the data bus on bus turnaround. As a result, no "dead cycles" are needed on the data bus, thereby increasing bandwidth on the data bus.

The configurable modes of the cache control unit 108 provide several advantages compared to conventional cache subsystems. For example, when the processor clock speed is much greater than the fastest available SRAM clock speeds, the cache control unit 108 can be configured for the 2-2 mode. The 2-2 mode provides relatively high bandwidth and low read latency compared to the conventional method of using the 1-1-1 mode with a SRAM clock rate of half the processor clock rate. As a result, when a new generation of SRAMs becomes available that can operate at the processor clock rate, the cache subsystem 102 can then be easily upgraded simply by replacing the SRAM 106 with the new faster SRAMs and reconfiguring the cache control unit 108 to operate in the 1-1-1 mode. As a result the performance of the upgraded cache subsystem is improved (i.e., a lower read latency and higher bandwidth than before). Similarly, when a cache subsystem 102 is configured in the 1-1-1 mode and a faster processor 104 becomes available, the cache subsystem 102 can be upgraded without changing the SRAM 106 by replacing the processor 104 with the new faster processor and reconfiguring the cache control unit 108 into the 2-2 mode.

Figure 2:
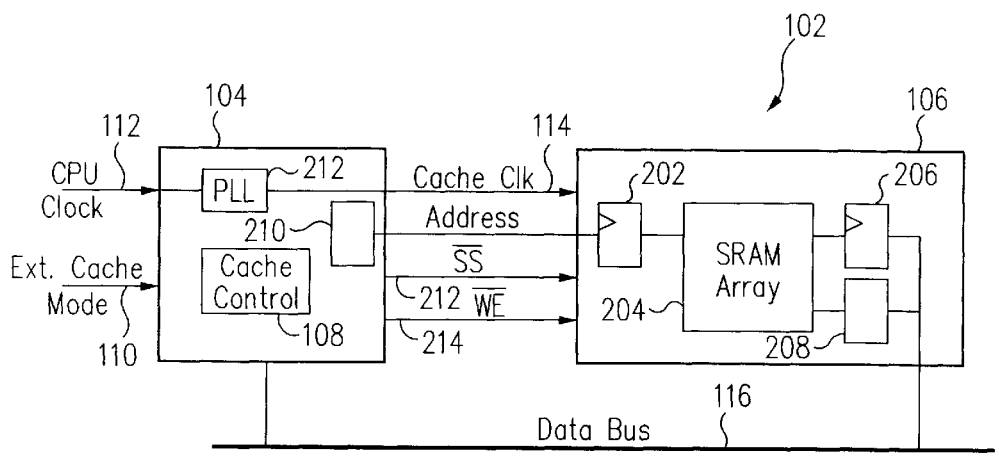
FIG. 2 is a block diagram of an external cache subsystem using an SRAM having a pipelined architecture according to one embodiment of the present invention.

FIG. 2 is a block diagram of the external cache subsystem 102 using an SRAM 106 having a pipelined architecture according to one embodiment of the present invention. In this embodiment, the SRAM 106 is an aforementioned model IBM043611RLA SRAM the datasheet of which is herein incorporated by reference. The SRAM 106 includes an input register 202, a SRAM array 204, an output register 206 and a write buffer 208. Of course, the cache subsystem also includes conventional cache tag and index comparators and miss handling circuits (not shown) that are omitted for clarity and conciseness. The input register 202 is connected to the processor 104 to receive addresses for memory access. The SRAM array 204 is connected to the input register 202, the output register 206 and the write buffer 208, through which the SRAM array 204 is accessed. The external cache subsystem 102 operates in the 1-1-1 mode as described above in conjunction with FIG. 1.

The processor 104 includes an address register 210 and a phase locked loop (PLL) 212, as well as the cache control unit 108. The address register 210 is connected to the input register 202 of the SRAM 106. The cache control unit 108 of the processor 104 provides read, write and deselect commands to the SRAM 106 over lines 212 and 214. More specifically, the cache control unit 108 provides a synchronous select ($\overline{SS}$) signal through the line 212 and write enable ($\overline{WE}$) signal to the SRAM 106 through the line 214. The $\overline{SS}$ and $\overline{WE}$ signals provide the read, write and deselect commands as summarized in Table 1.

TABLE 1

| $\overline{SS}$ | $\overline{WE}$ | COMMAND |
|---|---|---|
| 0 | 0 | WRITE |
| 0 | 1 | READ |
| 1 | 0 | DESELECT |
| 1 | 1 | DESELECT |

As described above, in one embodiment of the 1-1-1 mode, the processor 104 receives an external clock signal of half the desired processor clock frequency and doubles the frequency to generate the processor clock signal. In this embodiment, the PLL 212 is used to generate the processor clock signal at twice the frequency of the external clock signal. The processor 104 also provides this clock signal to the SRAM 106 through the lead 114.

Figure 3:
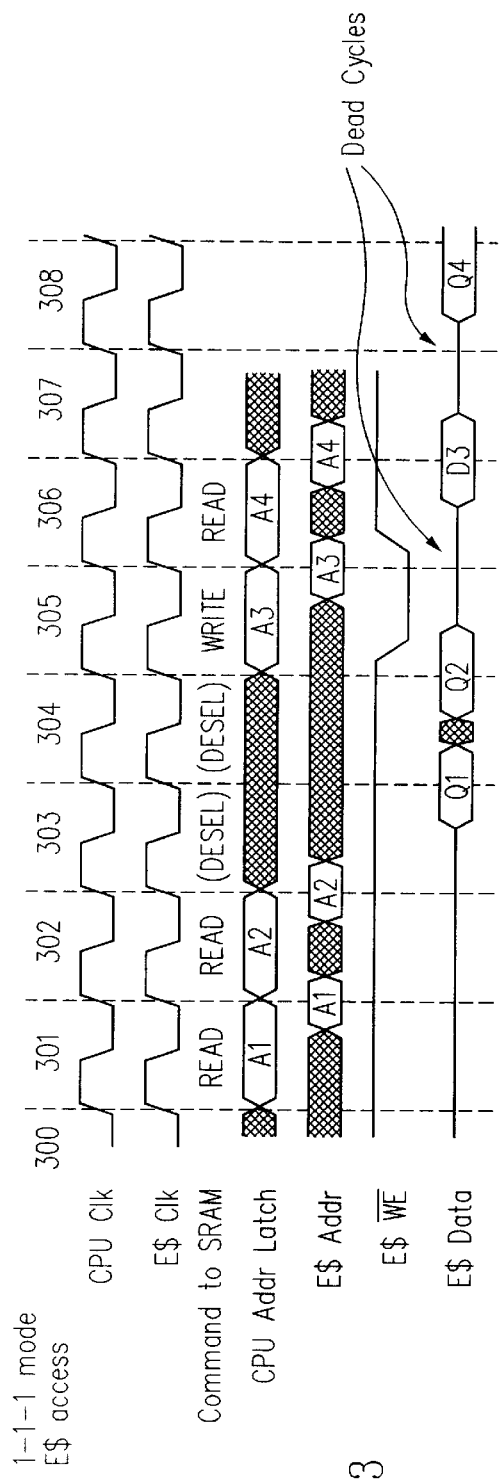
FIG. 3 is an exemplary timing diagram of the external cache subsystem depicted in FIG. 2.

FIG. 3 is an exemplary timing diagram of the external cache subsystem 102 depicted in FIG. 2, according to one embodiment of the present invention. Referring to FIGS. 2 and 3, the operation of the cache subsystem 102 is described for an exemplary sequence of two read operations followed by a write operation and then another read operation. In a processor clock cycle 301, the cache control unit 108 provides a read command to the SRAM 106 during the clock cycle 301 by causing the $\overline{SS}$ signal to be at a logic low level (i.e., the $\overline{SS}$ signal is asserted) on the line 212 and the $\overline{WE}$ signal to be at a logic high level (i.e., the $\overline{WE}$ signal is not asserted) on the line 214. During this same clock cycle, the address register 210 of the processor 104 provides the first read address A1 to the input register 202.

In a next processor clock cycle 302 (i.e., the second processor clock cycle of the first read operation), the SRAM array 204 is accessed at address A1. In addition, during this clock cycle, the cache control unit provides another read command to the SRAM 106 over lines 212 and 214 in accordance with Table 1. The read address register 210 also provides a second read address A2 that is received by the input 202. The read address A2 can be any address in the address space and not merely an increment of the previous address. That is, consecutive read operations according to the present invention need not be in a "burst mode." Thus, the processor 104 "randomly accesses" the SRAM 106 during consecutive accesses.

Then, in a processor clock cycle 303, the cache control unit 108 provides a deselect command in preparation for the subsequent write operation. As stated above, the deselect command is required in the 1-1-1 mode to prevent bus contention during bus turnaround. This first deselect command helps provide a "dead cycle" on the data bus 116 between the read data of the second read operation and the write data for the upcoming write operation. Further, the clock cycle 303 is the third clock cycle of the first read operation and the second clock cycle of the second read operation. Thus, during the clock cycle 303, the read data Q1 for the first read operation is clocked into the output register 206 and the SRAM array 204 is accessed at the address A2. The output register 206 outputs the read data Q1 onto the data bus 116 with sufficient hold time into the next clock cycle for the processor 104 to receive the data.

In a next processor clock cycle 304, the cache control unit 108 provides a second deselect command (i.e., deasserts the $\overline{SS}$ signal) to the SRAM 106. As described below, this deselect command is needed to help provide a "dead cycle" between the write data of the write operation and the read data of the upcoming third read operation. This "dead cycle" helps prevent bus contention during the bus turnaround. In addition, the clock cycle 304 is the third clock cycle of the second read operation; consequently, the read data Q2 is clocked into the output register 206, which outputs the read data Q2 onto the data bus 116.

In a next processor clock cycle 305, the cache control unit 108 provides a write command (i.e., asserts both the $\overline{SS}$ signal and the $\overline{WE}$ signal) to the SRAM 106, while the address register 210 provides the write address A3 to input register 202. The SRAM 106 uses a "late-write" architecture in which write data is stored in the write buffer 208 and then written into the SRAM array 204 during the next write operation (which may occur after one or more intervening read operations). Because the write data is first written to the write buffer 208, the access time of the SRAM array 204 does not affect the timing of the write operation. The write buffer 208 can be loaded with the write data much faster than the SRAM array 204 can be written. Any write data already present in the write buffer 208 from a previous write operation is stored in the SRAM array 204 during the next clock cycle (i.e., clock cycle 306, which is the second clock cycle of the write operation). The write buffer 208 allows the SRAM array 204 to use approximately the entire clock cycle 306 to store this previously buffered write data.

Moreover, during the clock cycle 305, because the data bus 116 is not driven after the read data Q2 is driven onto the data bus 116, the data bus 116 has a "dead cycle." Consequently, the "dead cycle" occurs between the read data provided by the SRAM 106 and the write data provided by the processor 104 during the next processor clock cycle 306. As a result, there is no contention on the data bus 116 on the bus turnaround.

In this next processor cycle 306, the cache control unit 108 provides the third read command to the SRAM 106. Also during this clock cycle, the address register 210 provides the read address A4 to the input register 202. The clock cycle 306 is also the second clock cycle of the write operation, during which the processor 104 provides the write data D3 onto the data bus 116, with sufficient hold time into the next clock cycle for the write buffer in the SRAM 106 to receive the write data. As stated above, previously buffered write data already in the write buffer 208 is written into the SRAM array 204 during this clock cycle.

Then, in a next processor cycle 307 (i.e., the second clock cycle of the third read operation and the third clock cycle of the write operation), the SRAM array 204 is accessed at address A3 as described above. The SRAM array 204 can be accessed during this clock cycle because the write data D3 is being stored in the write buffer 208. The write data D3 will be stored in the SRAM array 204 during the second cycle of the next write operation, according to the late write scheme. Because the read data of the third read operation is not available until the next clock cycle (i.e., clock cycle 308), the data bus has another "dead cycle," thereby preventing bus contention on the bus turnaround. Then, in the next processor clock cycle 308 (i.e., the third clock cycle of the third read operation), the read data Q4 is stored in the output register 206 and driven onto the data bus 116.

Figure 4:
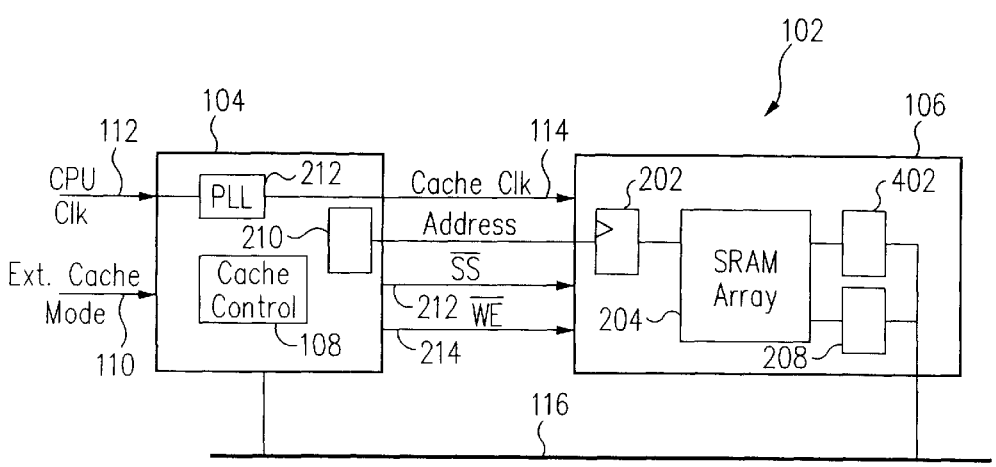
FIG. 4 is a block diagram of an external cache subsystem using an SRAM having a flow-through architecture according to one embodiment of the present invention.

FIG. 4 is a block diagram of an external cache subsystem 102 using an SRAM 106 having a flow-through architecture according to another embodiment of the present invention. This embodiment of the external cache subsystem 102 is substantially identical in structure to the embodiment of FIG. 2, except that the SRAM 106 has an output latch 402 instead of an output register 206 (FIG. 2) and the cache control unit 108 is configured into the 2-2 mode. In this embodiment, the SRAM 106 is the aforementioned CXK77B3610 SRAM, although any flow-through architecture SRAM that is fast enough to access the SRAM array 204 within two processor clock cycles can be used. In addition, the SRAM 106 receives the SRAM clock signal at essentially half the frequency of the processor clock signal. In one embodiment the SRAM clock signal is the aforementioned external clock signal that the PLL 212 of the processor 104 doubles to generate the processor clock signal.

Figure 5:
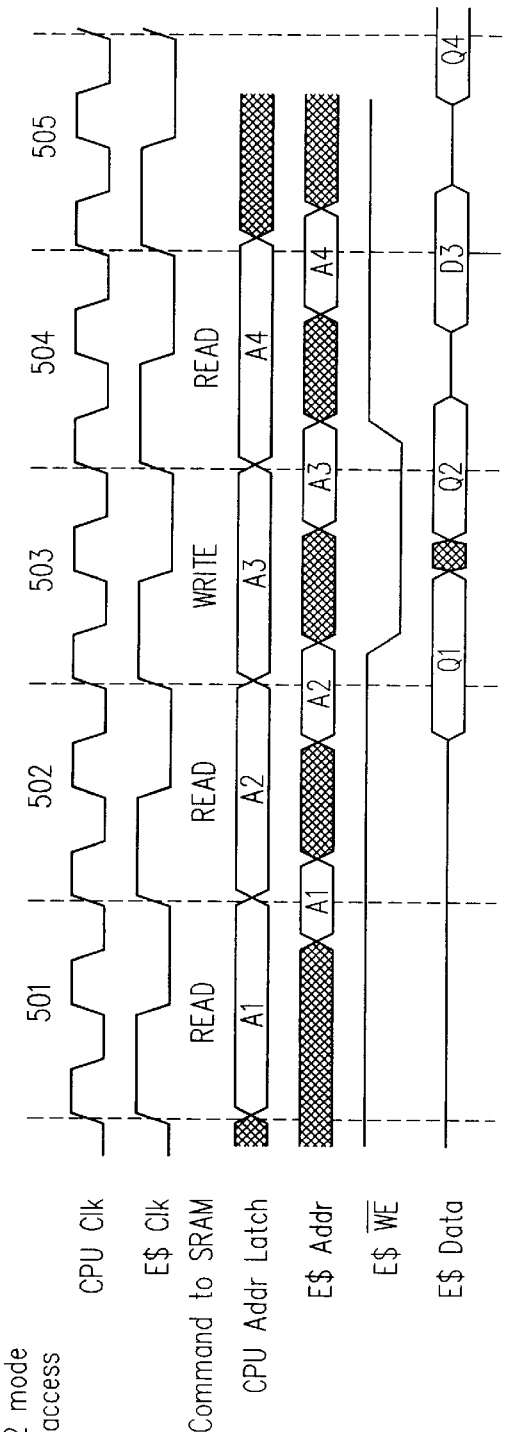
FIG. 5 is an exemplary timing diagram of the external cache subsystem depicted in FIG. 4.

FIG. 5 is an exemplary timing diagram of the external cache subsystem 102 depicted in FIG. 4, according to one embodiment of the present invention. Referring to FIGS. 4 and 5, the aforementioned exemplary sequence of two read operations followed by a write operation and a third read operation is described for the 2-2 mode. As described above, the 2-2 mode does not require any deselect cycles; therefore, the $\overline{SS}$ signal is maintained at a logic low level (i.e., asserted) during 2-2 mode external cache accesses. The cache control unit 108 provides a first read command during a first SRAM clock cycle 501. The processor clock signal goes through two cycles during the first SRAM clock cycle 501. During the first SRAM clock cycle 501, the address register 210 provides the first read address A1 to the input register 202 of the SRAM 106.

During a next SRAM clock cycle 502, the cache control unit 108 provides the second read command to the SRAM 106, while the address register 210 provides the second read address A2 to the input register 202. The SRAM clock cycle 502 is also the second SRAM clock cycle of the first read operation, in which both the SRAM array 204 is accessed and the output latch 402 receives the read data Q1. The output latch 402 is open when the SRAM clock signal is low and closed when the SRAM clock signal is high. Consequently, the output latch 402 is open when valid read data is received from the SRAM array 204 and flows through to the data bus 116. The latch 402 then closes on the rising edge of the SRAM clock signal, thereby causing the output latch to output the valid read data until the next failing edge of the SRAM clock signal. Thus, the output latch 402 drives the read data Q1 onto the data bus 116 with sufficient hold time into the next processor clock cycle so that the processor 104 may receive the read data Q1.

Then in a next SRAM clock cycle 503, the cache control unit 108 provides a write command to the SRAM 106 and asserts the $\overline{WE}$ signal. In addition, during this clock cycle, the address register 210 provides the write address to the input register 202. The SRAM clock cycle 503 is also the second SRAM clock cycle of the second read operation and, thus, the second read data Q2 is read from the SRAM array 204 and outputted onto the data bus 116. In this embodiment, the SRAM 106 also uses a "late write" scheme. Thus, any previously buffered write data in the write buffer 208 is stored in the SRAM array in response to the $\overline{WE}$ signal, in the next SRAM clock cycle (i.e., SRAM clock cycle 504) after the read data Q2 is accessed in SRAM clock cycle 503.

In the next SRAM clock cycle 504, the cache control unit 108 provides the third read command and deasserts the $\overline{WE}$ signal. The address register 210 of the processor 104 provides the read address to the input register 202, and the processor 104 provides the write data D3 onto the data bus 116 where it is received by the write buffer 208 in the SRAM 106 during the later part of the SRAM clock cycle. In addition, as stated above, any previously buffered write data is written to the SRAM array 204 during this SRAM clock cycle. This writing of the buffered write data into the SRAM array 204 occurs in the early part of this SRAM clock cycle, but does not interfere with the read access because the read access of the SRAM array 204 for the third read operation occurs in the next SRAM clock cycle (i.e., the second SRAM clock cycle of the third read operation). Because of the longer SRAM clock cycles in this embodiment, there is sufficient time between turning off and on the drivers of the processor 104 and the output latch 402 to avoid bus contention, thereby eliminating the need for a "dead cycle" on bus turnaround. Then, in a next cycle 505, the SRAM array 204 is accessed and the read data Q4 is output on the data bus 116 as previously described. Again, there is no "dead cycle" on the bus turnaround.

Figure 6:
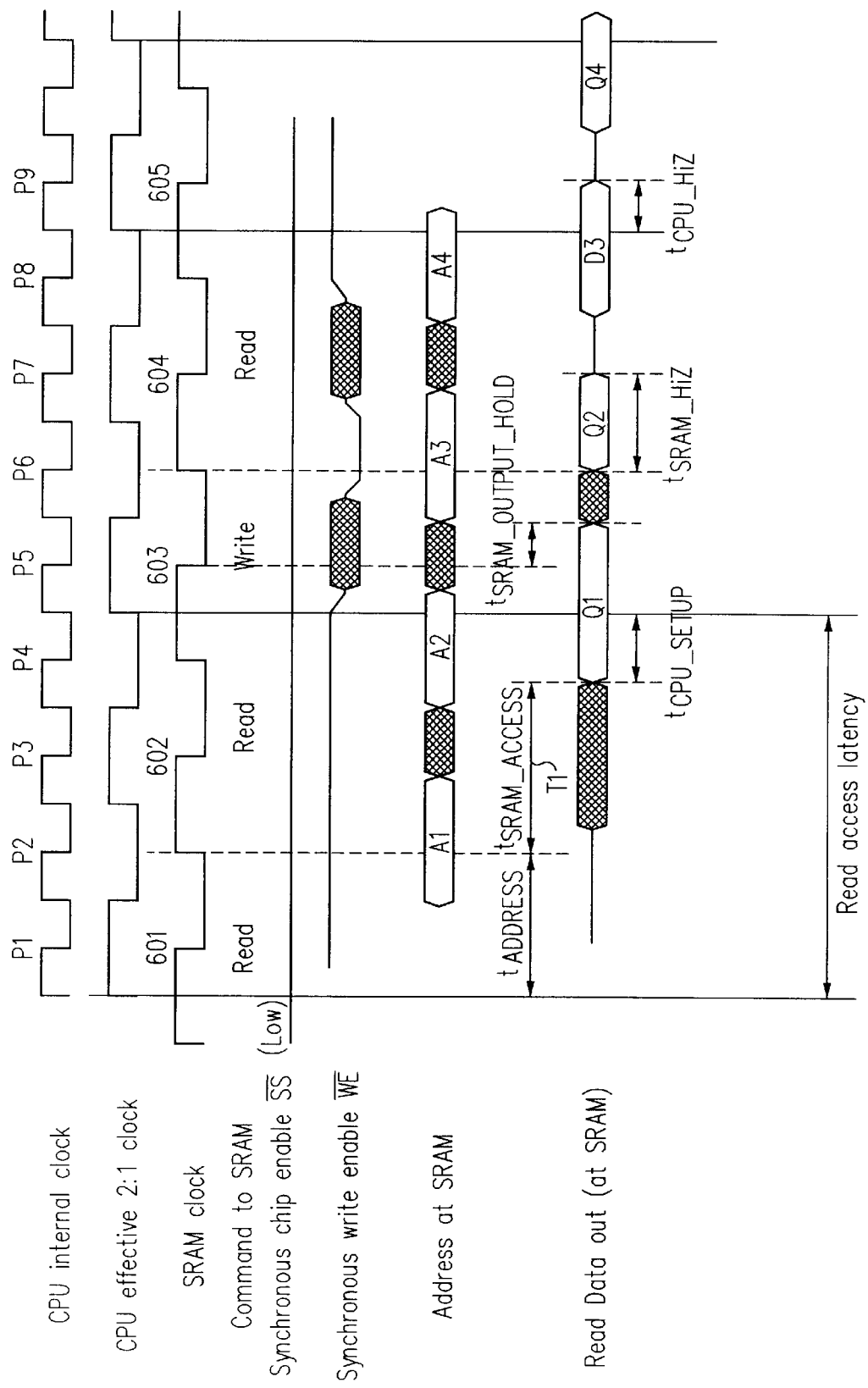
FIG. 6 is an alternative exemplary timing diagram of the external cache subsystem depicted in FIG. 4.

FIG. 6 is an exemplary timing diagram of the external cache subsystem 102 depicted in FIG. 4, according to an alternative embodiment of the present invention. This embodiment is advantageously used where the SRAM 106 is not fast enough to access the SRAM array 204 and provide valid data on the data bus 116 within two processor clock cycles. The SRAM clock signal is "earlied up" or skewed so that the SRAM array 204 is accessed before the end of the first two processor clock cycles of a read operation. The SRAM clock signal can be "earlied up" because the input register 202 does not require a full SRAM clock cycle to be loaded with the read address. As a result the SRAM array can be accessed during the first two processor clock cycles of a read operation without affecting the validity of the read address. This extra time allows the SRAM array 204 to be accessed with sufficient time during the next two processor clock cycles for the output latch 402 to receive and output the read data Q1 onto the data bus 116 before the end of the second SRAM clock cycle of the read operation.

To provide the skew, in one embodiment, an external delay buffer (not shown) is used to delay the external clock signal provided to the processor 104, which then doubles the frequency of this delayed external clock signal as described above. However, the SRAM 106 receives the external clock signal without the delay. As a result, the SRAM clock signal starts earlier than the processor clock signal (hence the name earlied up). The external delay buffer can be any conventional delay buffer such as, for example, a series of inverters or other gates. Of course, in other embodiments, any suitable technique for skewing the SRAM clock signal relative to the processor clock signal can be used.

Referring to FIGS. 4 and 6, the aforementioned exemplary sequence of two read operations followed by a write operation and a third read operation is described for the skewed clock scheme. Because the processor clock rate is twice the SRAM clock rate, the processor provides the read and write addresses on every other processor clock cycle (i.e., processor clock cycles P1, P3, and P5 as shown in FIG. 6). In a processor clock cycle P1 (i.e., during approximately the middle of the SRAM clock cycle 601), the address register 210 of the processor 104 provides the read address to the SRAM 106. The input register 202 of the SRAM 106 then receives the read address in the later part of a SRAM clock cycle 601, corresponding to the processor clock cycle P2. The SRAM array 204 is then accessed during the processor clock cycles P2 and P3 (i.e., during approximately the first three quarters of the SRAM clock cycle 602), as indicated by the interval T1. The SRAM array 204 then provides the accessed read data Q1 to the output latch 402 during the later part of the SRAM clock cycle 602 (i.e., the second SRAM clock cycle of the first read operation). Thus, the read data Q1 is available on the data bus 116 at the end of the fourth processor clock cycle P4. On the rising edge of SRAM clock cycle 602, the output latch 402 closes, thereby holding the read data Q1 on the data bus 116 during processor clock cycle P5.

The processor 104 provides the second read address for the second read operation during the processor clock cycle P3. The second read address is received by the input register 202 during the next processor clock cycle P4 (i.e., the later part of the second SRAM clock cycle 602). The SRAM array 204 is then accessed during the early part of the SRAM clock cycle 603 (i.e., processor clock cycles P4 and P5), providing the read data Q2 to the output latch 402 at the end of the SRAM clock cycle 603 during the processor clock cycle P6 (i.e., the second SRAM clock cycle of the second read operation).

The processor 104 provides the write address for the write operation to the SRAM 106 during the processor clock cycle P5, which corresponds to approximately the middle of the SRAM clock cycle 603. In addition, as shown in FIG. 6, the $\overline{WE}$ signal is asserted during the processor clock cycle P6, which corresponds to the SRAM cycle 603. The input register 202 of the SRAM 104 receives the write address during the later part of the SRAM clock cycle 603 (i.e., during the processor clock cycle P6). Any previously buffered write data in the write buffer 208 is then written to the SRAM array during the early part of the next SRAM clock cycle 604 (i.e., during the processor clock cycles P7 and P8). Also during the later part of the SRAM clock cycle 604, the write buffer 208 receives the write data D3 from the processor 104, which is clocked into the write buffer on the rising edge of the next SRAM clock cycle 604 (i.e., the end of the second SRAM clock cycle of the write operation).

In the third read operation, the processor 104 provides the third read address to the SRAM 106, which receives this read address during the processor clock cycle P8 (i.e., the later part of the SRAM clock cycle 604). In a like manner to the previous read operations, the SRAM array is accessed during the next two processor clock cycles (i.e., processor clock cycles P9 and P10 so that the third read data is output by the output latch 402 by the end of the next SRAM clock cycle 605 (i.e., the second SRAM clock cycle of the third read operation).

In still another embodiment different methods of implementing a flow-through SRAM may be used. For example, the SRAM may have a self-timed output register that is clocked using clock signals provided by a self-timed delay circuit and an independent clock signal. The output register is clocked at the later of the two clock signals. The self-timed clock signal causes the read data to appear to flow through the output register, but the data is held in the output register under the control of the independent clock signal.

Figure 7:
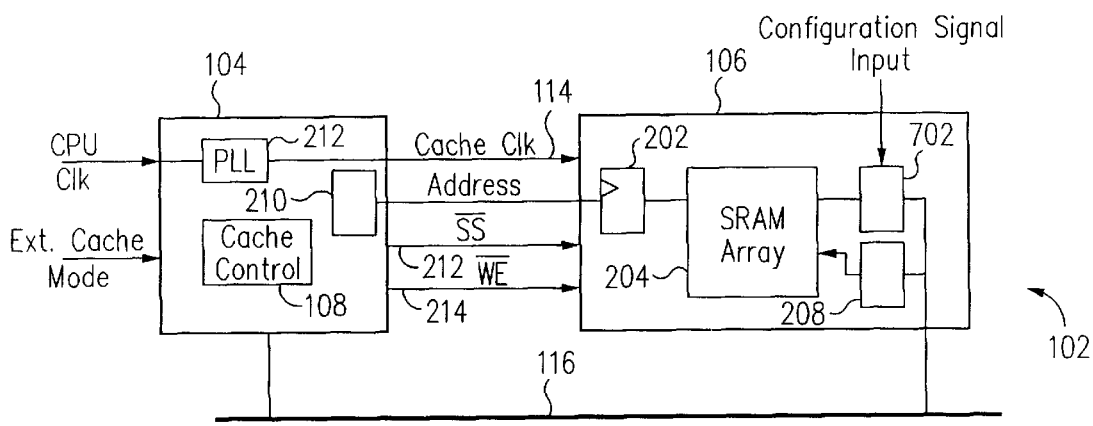
FIG. 7 is a block diagram of an external cache subsystem using an SRAM that is configurable as either a pipelined or a flow-through architecture SRAM and FIG. 8 is a schematic diagram of a cache control unit according to one embodiment of the present invention.

FIG. 7 is a block diagram of an external cache subsystem using an SRAM that is configurable as either a pipelined or a flow-through architecture SRAM. This embodiment of the external cache subsystem 102 is substantially identical in structure to the embodiment of FIG. 2, except that the SRAM 106 has an output device 702 that can be configured to operate as the output register 206 FIG. 2) or the output latch 402 (FIG. 4). For example, the SRAM 106 can be a model CXK77B3610 synchronous SRAM available from Sony. In this embodiment, the processor 104 provides a SRAM configuration signal to configure the SRAM 106 as desired. This embodiment is advantageously used in applications where the processor clock frequency can be increased to beyond the capabilities of the SRAM 106. For example, in a cache subsystem where the SRAM 106 is fast enough to support operation in the 1-1-1 mode for the processor 104, the processor can be replaced with a substantially identical second processor having a faster clock rate without also being required to also upgrade the SRAM 106. The SRAM 106 can simply be reconfigured into the flow-through architecture. Of course, the cache control unit 108 should also be reconfigured into the 2-2 mode.

Figure 8:
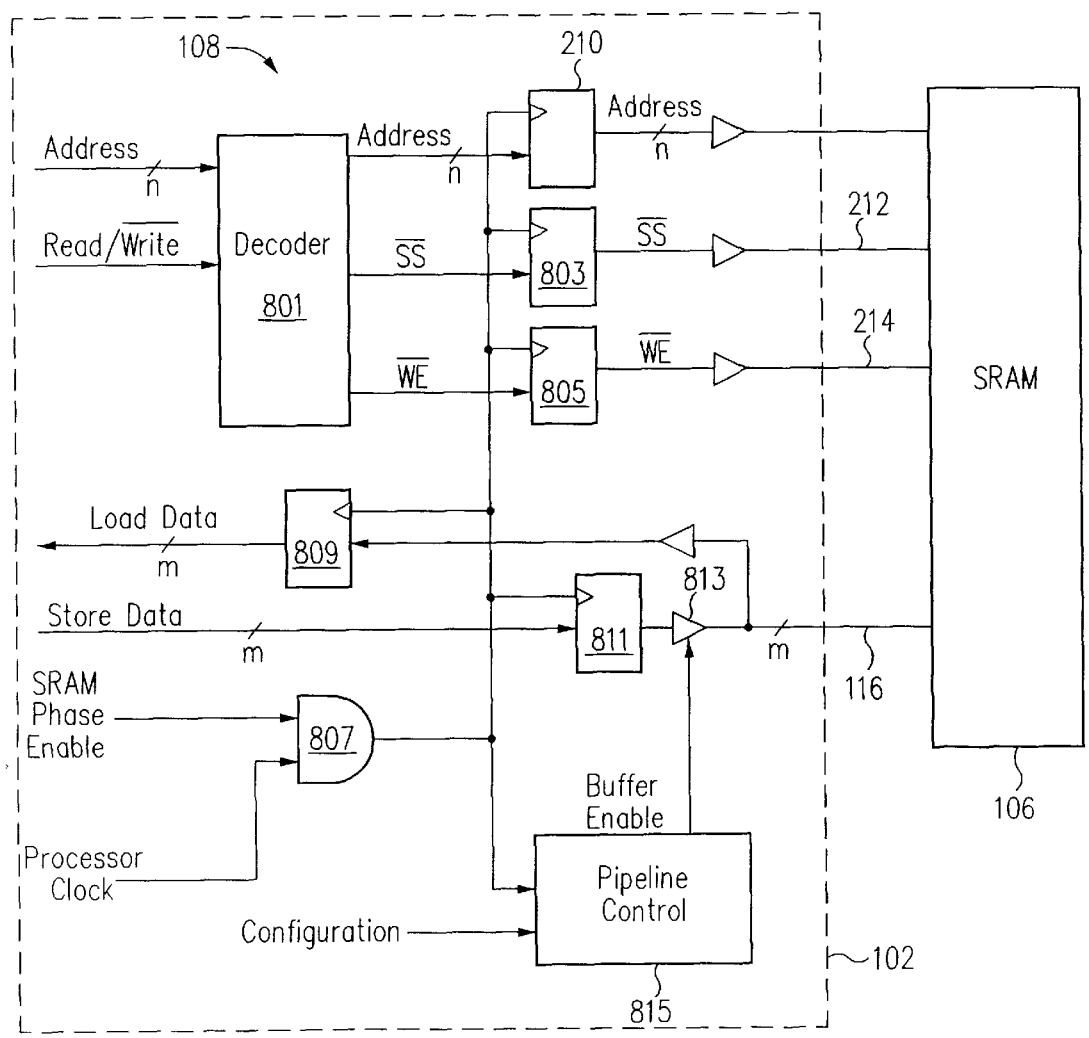

FIG. 8 is a schematic diagram of the cache control unit 108 of the processor 104, according to one embodiment of the present invention. For providing the access commands and addresses, the cache control unit 108 includes a decoder 801, a $\overline{SS}$ register 803, and a $\overline{WE}$ register 805 as well as the aforementioned address register 210. The $\overline{SS}$ register 803 has an input lead connected to the decoder 801 and an output lead coupled to the line 212 through a buffer. Similarly, the $\overline{WE}$ buffer 805 has an input lead connected to the decoder 801 and an output lead coupled to the line 214 through a buffer. In addition, the cache control unit 108 includes a gate 807 in this embodiment for providing clocking signals for the $\overline{SS}$ register 803, the $\overline{WE}$ register 805 and the address register 210. The gate 807 is a high speed two-input AND gate with one input lead coupled to receive the processor clock signal from the PLL 212 (FIG. 7) and the other input lead coupled to receive a SRAM phase enable signal also generated by the PLL 212. The output lead of the gate 807 is connected to the clock input leads of the registers 210, 803 and 805. In an alternative embodiment these registers may have a clock-enable input lead coupled to receive the SRAM phase enable signal, thereby eliminating the gate 807.

For receiving read data and providing write data, the cache control unit 108 includes a load data register 809 and a store data register 811. The registers 809 and 811 also receive the gated clock signal from the gate 807. The load data register 809 has input leads coupled to the data bus 116 through a buffer and output leads coupled to the internal caches and register files of the processor 104. The store data register 811 has input leads coupled to the load-store unit of the processor and output leads coupled to the data bus 116. Because the data bus 116 is bidirectional, the output leads of the store data register 811 are connected to an output buffer 813 that is enabled by a pipeline control circuit 815. The output buffer 813 presents a high impedance to the data bus 116 when disabled. The pipeline control circuit 815 disables the output buffer 813 when the cache control unit 108 is not providing write data to the data bus 116, thereby allowing the SRAM 106 to more easily drive read data onto the data bus 116.

In operation, the decoder 801 receives read, write or deselect commands from the processor 104. The processor 104 is programmed to provide these access commands in accordance with the timing for the 1-1-1 or 2-2 modes described above, depending on the configuration. Thus, if the processor 104 is configured in the 1-1-1 mode, the processor 104 will provide read or write commands (with two deselect commands before a write command following a read command) on every processor clock cycle. Similarly, if the processor 104 is configured in the 2-2 mode, the processor 104 will provide write or read commands on every other processor clock cycle.

The decoder 801 receives the access commands and then provides the $\overline{SS}$ and $\overline{WE}$ signals to the $\overline{SS}$ and $\overline{WE}$ registers 803 and 805 according to Table 1. The address, $\overline{SS}$ and $\overline{WE}$ registers 210, 803 and 805 then provide the address and the $\overline{SS}$ and $\overline{WE}$ signals to the SRAM 106 when clocked by the gated clock signal provided by the gate 807. In the 1-1-1 mode, the pipeline control circuit 815 maintains the SRAM phase enable signal at a logic high level, thereby causing the gate 807 to pass the processor clock signal to the registers 210, 803, 805, 809 and 811. However, in the 2-2 mode, processor 104 causes the SRAM phase enable signal to be at a logic high level during every other rising edge of the processor clock signal.

The load data register 809 registers the data on the data bus 116 as clocked by the gated clock signal from the gate 807. Thus, the load data register 809 receives write data and invalid data as well as the read data from the SRAM 106. However, the processor 104 is programmed to accept the data in the load data register 809 at the end of the third or fourth processor clock cycle after a read command, depending on whether the processor is configured in the 1-1-1 or 2-2 mode.

The store data register 811 clocks in write data provided by the processor 104 under the control of the gated clock signal from the gate 807. However, the data clocked into the store data register 811 is not driven onto the data bus 116 until the buffer 813 is enabled by the pipeline control circuit 815. The pipeline control unit 815 enables the buffer 813 during the second SRAM clock cycle of each write operation for both the 1-1-1 and 2-2 modes.

It is to be understood that the embodiments of the invention described above are illustrative of the principles of the invention and are not intended to limit the invention to those embodiments. For example, different embodiments can have other circuits for generating the processor and SRAM clock signals. In one such embodiment, a clock buffer circuit is used to receive the external clock signal and distribute it to the SRAM and the processor. In addition, in other embodiments, the cache subsystem may include separate SRAMs for instructions and data. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A cache memory subsystem comprising:
    a memory configured to operate at a memory clock rate;
    a processor configured to operate at a processor clock rate and to provide memory access commands to access said memory; and
    a cache control unit coupled to said processor and said memory, wherein said cache control unit is configured to provide at least one control signal to said memory in response to said memory access commands, said cache control unit having a pipelined access mode with a first read latency measured in processor clock cycles and having a flow-through access mode with a second read latency measured in processor clock cycles, and wherein said second read latency is not substantially equal to a multiple of said first read latency wherein said cache control unit is configured to operate in said pipelined access mode when said memory clock rate is substantially identical to said processor clock rate and configured to operate in said flow-through access mode when said processor clock rate is substantially equal to a multiple of said memory clock rate.

2. The subsystem of claim 1 wherein said processor is configured to randomly access said memory during consecutive memory accesses.

3. The subsystem of claim 1 wherein said cache control unit is coupled to receive a configuration signal, said cache control unit being configured into one of said pipelined access mode and said flow-through access mode in response to said configuration signal.

4. The subsystem of claim 1 wherein said processor includes said cache control unit.

5. The subsystem of claim 1 wherein said memory is external to said processor.

6. The subsystem of claim 1 wherein said memory comprises a synchronous static random access memory.

7. The subsystem of claim 6 wherein said memory can be selectably configured into a flow-through access architecture and wherein said memory can be selectably configured into a pipelined architecture.

8. The subsystem of claim 6 wherein said first read latency is equal to approximately three processor clock cycles and said second read latency is equal to approximately four processor clock cycles.

9. The subsystem of claim 6 wherein said memory comprises a late-write synchronous static random access memory.

10. The subsystem of claim 1 wherein said memory comprises a pipeline architecture static random access memory configured to operate at said processor clock rate.

11. The subsystem of claim 10 wherein said memory is configured to provide read information requested by said processor to said processor during a nth memory clock cycle and to receive write information provided by said processor on a n+1th memory clock cycle, n being an integer greater than zero.

12. The subsystem of claim 1 wherein said memory comprises a flow-through access architecture static random access memory is configured to be operated at one half of the processor clock rate when said cache control unit is operating in said flow-through access mode, and wherein said second read latency is less than twice said first read latency.

13. The subsystem of claim 12 wherein said memory is capable of receiving write information provided by said processor during a mth memory clock cycle and providing read information requested by said processor to said processor on a m+1th memory clock cycle, m being a whole number greater than zero.

14. A method of accessing an external cache memory that includes a synchronous random access memory, said method comprising:
    configuring a cache control unit, said cache control unit having a pipelined access mode and a flow-through access mode;
    accessing said synchronous random access memory at a memory clock rate substantially identical to a clock rate of a processor coupled to said synchronous random access memory when said cache control unit is configured in said pipelined access mode; and
    accessing said synchronous random access memory at a processor clock rate substantially equal to a multiple of said clock rate of said memory when said cache control unit is configured in said flow-through access mode;
        wherein said synchronous random access memory provides valid requested read information stored in said synchronous random access memory in at least one less memory clock cycle while said cache control unit is configured in said flow-through access mode than when said cache control unit is configured in said pipelined access mode.

15. The method of claim 14 wherein said synchronous random access memory comprises a synchronous static random access memory.

16. The method of claim 14 wherein said accessing said synchronous random access memory when said cache control units configured in said flow-through access mode comprises providing requested read information stored in said synchronous random access memory in an nth memory clock cycle and receiving write information to be stored in said synchronous random access memory in an n+1th memory clock cycle, n being an integer greater than zero.

17. The method of claim 14 wherein said accessing said synchronous random access memory when said cache control unit is configured in said pipelined access mode comprises reading said synchronous random access memory at random locations during consecutive read operations.

18. The method of claim 14 wherein said accessing said synchronous random access memory when said cache control unit is configured in said pipelined access mode comprises providing information to said synchronous random access memory at random locations during consecutive write operations.

19. A computer system comprising:
   a random access cache memory configured to operate at a memory clock rate;
   a processor external to said memory and configured to operate at a processor clock rate, said processor also being configured to write information to and read information from said memory; and
   a cache control unit coupled to said processor and said memory, said cache control unit having a pipelined access mode with a first read latency and having a flow-through access mode with a second read latency, said cache control unit configured to operate in said pipelined access mode when said memory clock rate is substantially identical to said processor clock rate and configured to operate in said flow-through access mode when said processor clock rate is substantially equal to k times said memory clock rate, k being an integer greater than 1, wherein said second read latency is less than k times said first read latency.

20. The computer system of claim 19 wherein said processor is configured to randomly access said memory during consecutive accesses when said cache control unit is configured in said pipelined access mode.

21. The subsystem of claim 20 wherein said cache control unit is coupled to receive a configuration signal, said cache control unit entering one of said pipelined access mode and said flow-through access mode in response to said configuration signal.

22. The computer system of claim 21 wherein said memory comprises a pipeline architecture static random access memory configured to operate at said processor clock rate.

23. The computer system of claim 22 wherein said memory is configured to provide read information requested by said processor to said processor during a nth memory clock cycle and to receive write information provided by said processor on a n+1th memory clock cycle, n being an integer greater than zero.

24. The computer system of claim 21 wherein said memory comprises a flow-through access architecture static random access memory configured to operate at one half of the processor clock rate when said cache control unit is operating in said flow-through access mode, and wherein said second read latency is less than twice said first read latency.

25. The computer system of claim 24 wherein said memory is configured to receive write information provided by said processor during a mth memory clock cycle and to provide read information requested by said processor to said processor on a m+1th memory clock cycle, m being a whole number greater than zero.

26. A processor capable of providing memory access commands to access a memory, said memory having a memory clock rate, said processor having a processor clock rate, said processor comprising a cache control unit coupled to said memory, said cache control unit operative to provide at least one control signal to said memory in response to said memory access commands, said cache control unit having a pipelined access mode with a first read latency measured in processor clock cycles and having a flow-through access mode with a second read latency measured in processor clock cycles, wherein said second read latency is not substantially equal to a multiple of said first read latency wherein said cache control unit is configured to operate in said pipelined access mode when said memory clock rate is substantially identical to said processor clock rate and configured to operate in said flow-through access mode when said processor clock rate is substantially equal to a multiple of said memory clock rate.

27. The processor of claim 26 wherein said processor is configured to randomly access said memory during consecutive memory accesses.

28. The processor of claim 26 wherein said cache control unit is coupled to receive a configuration signal, said cache control unit being configured into one of said pipelined access mode and said flow-through access mode in response to said configuration signal.

29. A cache memory subsystem comprising:
   a memory configured to operate at a memory clock rate;
   a processor configured to operate at a processor clock rate, said processor configured to provide memory access commands to access said memory; and
   a cache control unit coupled to said processor and said memory, said cache control unit configured to provide at least one control signal to said memory in response to said memory access commands, said cache control unit having a pipelined access mode with a first read latency measured in memory clock cycles and having a flow-through access mode with a second read latency measured in memory clock cycles, wherein said second read latency is different from said first read latency wherein in said pipelined access mode said memory clock rate is substantially equal to said processor clock rate, and in said flow-through access mode said memory clock rate is less than said processor clock rate.

* * * * *